Aug. 30, 1966 A. J. RAMSAY ET AL 3,270,295

ELECTRIC PULSE GENERATORS

Filed May 6, 1964 2 Sheets-Sheet 1

INVENTORS
ALAN JAMES RAMSAY
WILLIAM KELVIN BOTTOMLEY
BY Arthur H. Swanson
ATTORNEY.

Aug. 30, 1966 A. J. RAMSAY ET AL 3,270,295

ELECTRIC PULSE GENERATORS

Filed May 6, 1964 2 Sheets-Sheet 2

INVENTORS
ALAN JAMES RAMSAY
WILLIAM KELVIN BOTTOMLEY
BY
ATTORNEY.

United States Patent Office 3,270,295

Patented August 30, 1966

3,270,295

ELECTRIC PULSE GENERATORS

Alan J. Ramsay, Glasgow, and William Kelvin Bottomley, Hamilton, Scotland, assignors to Honeywell Inc., a corporation of Delaware Filed May 6, 1964, Ser. No. 365,380

Claims priority, application Great Britain, May 17, 1963, 19,628/63

6 Claims. (Cl. 331—111)

Figures 1, 2:
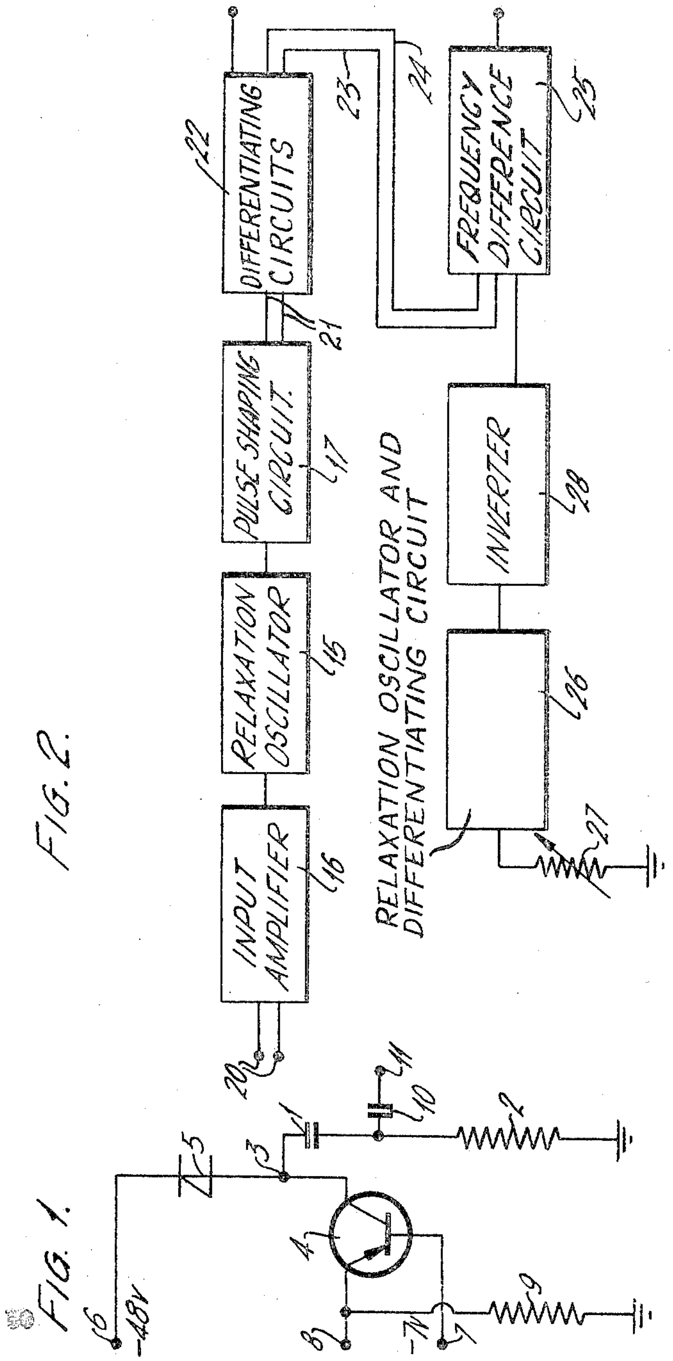

The present invention is concerned with electric pulse generators of the kind (hereinafter referred to as the kind specified) which in operation generate a train of pulses the recurrence frequency of which, at any instant, is representative of the magnitude of an applied signal. These generators are sometimes known as voltage/frequency converters or simply *v/f* converters.

According to the present invention an electric pulse generator of the kind specified comprises first and second relaxation oscillators the curcuit of each including a capacitor, a first current path for enabling the charge on the capacitor to be changed in one sense, said first current path including the base-collector circuit of a transistor connected as an amplifier in a common base configuration such that the magnitude of the emitter potential of the transistor controls the magnitude of the current flowing in the first current path, and a second current path for enabling the charge on the capacitor to be changed in the opposite sense, said second path including a Shockley diode and being arranged to pass a comparatively large current whenever the charge on the capacitor has changed by a predetermined amount in said one sense from a datum value, the pulse generator further comprising means for applying an electric signal potential to the emitter of the transistor in the first oscillator to vary the current in the first path thereof in accordance with the magnitude of the signal potential, means for applying an adjustable potential to the emitter of the transistor in the second oscillator to enable the magnitude of the current in the first path thereof to be preset, and means responsive to pulse trains generated by the two oscillators to produce an output pulse train having a recurrence frequency equal to the difference between the recurrence frequencies of the two oscillator pulse trains.

Each oscillator may have an output circuit including a differentiating circuit for generating a short output pulse on each occasion that the Shockley diode becomes conducting. Without the differentiating circuit, the outputs from the oscillators would be of sawtooth form and the differentiating circuits operate to produce pulses in response to the steep edges of the sawtooth waveform, these edges corresponding to the periods when the Shockley diodes are conducting.

The first oscillator may have pulse shaping and generating circuits associated with it for producing two output pulse trains which are identical except that one is delayed with respect to the other by a predetermined time for example a few milliseconds. When the first oscillator output circuit includes a differentiating circuit, the pulse shaping and generating circuits may include a first circuit, for example a monostable trigger circuit, for generating a pulse of duration equal to said predetermined time in response to each pulse produced by the oscillator and differentiating circuits for producing at a first output a pulse in response to the leading edge of each pulse generated by the first circuit and at a second output a pulse in response to the trailing edge of each pulse generated by the second circuit.

Where such pulse shaping and generating circuits are provided, the responsive means for producing the output pulse train having a recurrence frequency equal to the difference between the recurrence frequencies of the two oscillator pulse trains may comprise a two condition circuit, such as a bistable trigger circuit, arranged normally to be in its first condition and to be placed in its second condition by pulses of the output of the second oscillator, a first gate circuit arranged to produce an output pulse when a pulse occurs at the first output of the shaping and generating circuits and the two condition circuit is in its second state, a pulse generating circuit such as a monostable trigger circuit, for producing a pulse of predetermined duration (longer than said predetermined time) in response to each pulse produced by the first gate circuit, a second gate circuit to which the pulses from the second output of the shaping and generating circuits are applied and which is controlled by the output of the pulse generating circuit to allow the pulses to pass to an output only in the absence of a pulse from the generating circuit, and means for resetting the two condition circuit to its first condition whenever a pulse is produced by said pulse generating circuit.

It will be appreciated that the responsive means defined in the previous paragraph can only operate to produce the desired result if the predetermined duration of the pulses produced by the pulse generating circuit is shorter than the minimum possible interval between two successive pulses appearing at the second output of the pulse shaping and generating circuits, i.e., the minimum period of the first relaxation oscillator.

Figure 3:
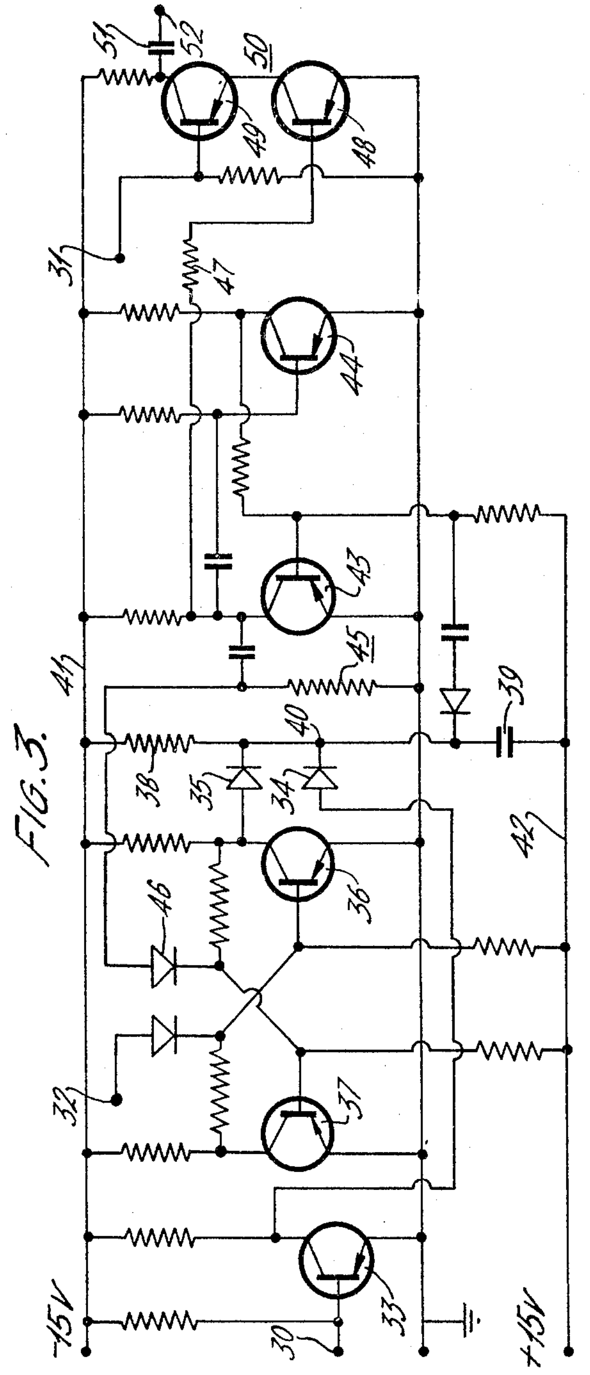

An example of an electric pulse generator according to the present invention will now be described with reference to the accompanying drawings in which:

FIG. 1 shows a circuit diagram of an example of a relaxation oscillator employed in the pulse generator, FIG. 2 shows a block circuit diagram of the pulse generator as a whole and FIG. 3 shows a circuit diagram of an example of the frequency difference circuit employed in FIGURE 2.

Referring first to FIGURE 1 of the drawings, this shows the circuit diagram of a relaxation oscillator circuit employed in the pulse generator. This includes a capacitor 1 one side of which is connected through a small resistor 2, for example 10 ohms, to earth. The other side of the capacitor 2 is connected to a terminal 3 to which also are connected the collector of a transistor 4 and one electrode of a Shockley diode 5. The other electrode of the diode 5 is connected to a terminal 6 to which a —48 volts D.C. unstabilised power supply is connected in operation.

The transistor 4 is connected as an amplifier in a common base configuration, its base being connected to a terminal 7 to which a stabilised —7 volts D.C. power supply is connected in operation. The emitter of the transistor 4 is connected to an input terminal 8, a resistor 9 being connected between terminal 8 and earth. A coupling capacitor 10 is connected between an output terminal 11 and the common terminals of the capacitor 1 and the resistor 2.

In the absence of any signal potential on terminal 8, the transistor acts as a high impedance "constant current" source for changing the charge on the capacitor 1 in the sense that such that the potential at the terminal 3, assuming it to be at a still more negative potential, rises substantially linearly towards —7 volts, the potential applied to terminal 7 in operation. The magnitude of the charging current in the absence of any signal on terminal 8 is determined by the resistor 9.

Shockley diodes have characteristics such that, as the voltage across them increases from zero, they have a very high impedance until the voltage reaches a critical value, usually about 20 volts, but that they assume a very low impedance as soon as this value is exceeded. The low impedance is maintained if the voltage is then decreased until a very much lower voltage, almost zero, has been reached, when the device returns to its high impedance state. For a given device, the difference between the two voltages is precisely defined. It will be seen therefore that the diode 5 will pass a large current whenever the potential at terminal 3 reaches a value such that the voltage across the diode 5 just exceeds the critical value. Assuming, for example, that the critical value is 20 volts this will occur when the capacitor 1 has charged through the transistor 4 so that the potential at terminal 3 is 20 volts less negative than the actual value (nominally 48 volts) of the potential applied to terminal 6. The potential at terminal 3 will then fall rapidly until it reaches the value at which the diode 5 returns to its high impedance state.

Thus there will be a cycle of operations in which the potential at terminal 3 falls rapidly to nearly −48 volts and then rises more slowly towards earth potential until the diode 5 conducts again returning the potential rapidly to −48 volts. The recurrence frequency of this cycle is determined, for a given capacitor 1, by the collector current in the transistor 4 and the characteristics of the diode 5. If the magnitude of the capacitor 10 is suitably determined and the circuit coupled to the output terminal 11 present a suitable resistive load, the output of the oscillator is differentiated to produce a train of negative going pulses, the recurrence frequency of which is determined by the potential applied to the input terminal 8. These pulses will coincide in time with the occasions at which the diode 5 becomes conducting.

Turning now to FIGURE 2 of the drawings, there is shown a block circuit diagram of an example of a pulse generator of the kind specified according to the invention. This includes two relaxation oscillators as described with reference to FIGURE 1. The first relaxation oscillator 15 has its input terminal 8 coupled to the output of an input amplifier 16 so that the potential at the collector of its transistor 4 is determined by the output of the amplifier 16. The output of the oscillator 15 is passed to a pulse shaping circuit 17, for example a monostable, which produces a "squared" negative going 4.5 millisecond pulse in response to each negative-going pulse produced at the output of the oscillator 15.

The input amplifier 16 may be required to accept very small D.C. signals in which case a relatively stable and drift-free design is required. It may for example include two complementary transistor amplifier stages in cascade, that is one stage employing a p-n-p transistor and the other an n-p-n transistor, to obtain the temperature stability provided by the use of complementary circuits. The first stage may be an emitter follower circuit, for example, to provide a high input impedance and the second an amplifier stage arranged to present a high output impedance to the emitter circuit of the transistor (transistor 4 in FIGURE 1) provided in the oscillator 15, so as to render it insensitive to any changes in the operation of the oscillator 15.

The pulse shaping circuit 17 may for example be a conventional monostable transistor trigger circuit arranged to produce 4.5 milli-second pulses in response to the short negative going pulses applied to its. Outputs one of the positive going and the other negative going 4.5 milli-second pulses are derived from the two "halves" of the circuit and are supplied separately over a pair of connections 21 to a pair of conventional differentiating circuits 22.

The differentiating circuits 22, shown for convenience as a single block in FIGURE 2, each differentiate one of the two pulse trains generated by circuit 17 with the result that, within the circuits 22 there are produced both positive and negative pulses coinciding with the leading edges of the pulses generated by circuit 17 and both positive and negative pulses coinciding with the trailing edges. The positive going pulses are separated within the circuit 22 and applied to output connections 23 and 24, those on connection 23 coinciding with the leading edges of the pulses generated by the circuit 17 and therefore each being 4.5 milli-seconds earlier than the corresponding pulse on connection 24. Connections 23 and 24 lead to separate inputs of a frequency difference circuit 25 to be described below. It will be appreciated that the pulse shaping circuit 17 and the differentiating circuits 22 are in this example the "pulse shaping and generating circuits" referred to in the claims as being associated with the first oscillator.

The pulse generator further includes a second relaxation oscillator 26 which is as described with reference to FIGURE 1, the terminal 8 in the circuit of oscillator 26 being connected, however, to one end of a variable resistor 27 the other end of which is earthed.

The set value of resistor 27 acts simply to determine the emitter potential of the transistor 4 and thus the frequency of the oscillator 26 as a whole. It is intended that this should be preset so that oscillator 26 acts as a reference to generate pulses at some convenient rate, say 40–50 pulses per second, at which the oscillator 15 is set to operate for zero applied signal.

The output of oscillator 26 which includes a differentiating circuit is coupled through an inverter/amplifier circuit 28 to the frequency difference circuit 25 which operates to produce an output pulse train the recurrence frequency of which is the difference, if any, of the recurrence frequencies of the pulse trains received from the two oscillators 15 and 26. The operation of an example of a circuit suitable for use as the circuit 25 is described in detail below with reference to FIGURE 3 of the drawings.

FIGURE 3 shows a diagram of one form of circuit for use as the frequency difference circuit 25 in FIGURE 2. This has three input terminals 30–32 of which terminal 30 is connected to connection 23, thus receiving positive going pulses coincident with the leading edges of those produced by shaping circuit 17, terminal 31 is connected to connection 24, thus receiving positive going pulses coincident with the trailing edges of the same pulses and therefore delayed by 4.5 milli-seconds with respect to those applied to terminal 30, whilst terminal 32 is connected to the output of the inverter 28, thus receiving positive going pulses. The pulses at terminals 30 and 31 recur at the frequency of oscillator 15 and those at terminal 32 at the frequency of oscillator 26.

Terminal 30 is connected directly to the base of a transistor 33 which is connected in a conventional amplifier circuit and is biased so that the transistor 33 is fully conducting in the absence of any pulse. The collector of transistor 33 is connected to the positive pole of a diode 34 forming with diode 35 a conventional diode gate circuit. The positive pole of diode 35 is connected to the collector of a transistor 36 which with transistor 37 is connected in a conventional bi-stable trigger circuit, whilst the negative poles of the two diodes 34 and 35 are connected together to the common terminal 40 of a resistor 38 and a capacitor 39 which are connected in series between H.T. supply lines 41 and 42. Supply line 41 is maintained at −15 v. D.C. in operation and line 42 at +15 v. D.C. by connections to a suitable power pack (not shown).

The potential at this common terminal 40 can only become negative if both diodes 34 and 35 are in a condition to permit this and this will occur only if transistors 33 and 36 are both non-conducting. Otherwise one or both diodes will operate to prevent the common terminal 40 falling below approximately earth potential.

The bi-stable trigger circuit is arranged so that the appearance of a pulse at terminal 32 causes it to switch to the condition in which transistor 36 is non-conducting. This will occur, therefore, (assuming, as is the case, that it is at some same stage on each occasion switched back) each time a pulse is produced by oscillator 26. If, thereafter a pulse is produced by oscillator 15, the consequent positive pulse appearing at terminal 30 makes transistor 33 non-conducting and the condition for the common terminal 40 to be able to go negative is thus produced.

This results in the application of a negative going pulse to the base of a transistor 43 which, with transistor 44, forms a monostable trigger circuit arranged on triggering to change to its unstable state for 5 milli-seconds. Normally transistor 43 is non-conducting so that triggering produces a positive going 5 milli-second pulse at its collector. This is applied through a capacitor-resistor coupling circuit 45 and a diode 46 to the base of transistor 37 so as to return the bi-stable circuit to its original condition.

The positive going pulses at the collector of transistor 43 are also applied through a resistor 47 to the base of a transistor 48 forming, together with transistor 49, part of an output gate circuit 50. In circuit 50, the emitter of transistor 49 is connected to the collector of transistor 48, a load resistor being connected between the collector of transistor 49 and the negative H.T. line 41 whilst the emitter of transistor 48 is earthed. An output coupling capacitor 51 has one side connected to the collector of transistor 49 and the other to an output terminal 52. A resistor 53 is connected between the base of transistor 49 and earth an input terminal 31 is also connected to the same base. The connections are such that transistor 49 cannot conduct unless transistor 48 is also conducting. Thus no pulse can pass from terminal 31 to the output terminal 52 for the duration of any pulse produced by the mono-stable circuit since these are applied as positive going pulses to the base of the transistor 48, cutting it off.

The mono-stable circuit pulses last for 5 milliseconds following each pulse applied to terminal 30 which has been immediately preceded (i.e. no other pulse at terminal 30 has intervened) by a pulse at terminal 32. Since the pulses at terminal 31 follow those at terminal 30 after an interval of 4.5 milliseconds, triggering of the monostable circuit by a pulse at terminal 30 will prevent the corresponding pulse at terminal 31 passing to the output terminal 52. On the other hand, if there has not been an immediately preceding pulse at terminal 32, the monostable circuit is not triggered and the pulse at terminal 31 passes to the output terminal 52. Thus, since it is arranged that the frequency of oscillator 15 is never less than that of oscillator 26, a pulse train will appear at terminal 52 which has a repetition frequency equal as required to the difference of the frequencies of the two oscillators.

The pulse generator described above may be employed, for example, as the voltage/frequency converter of the apparatus described by way of example in our co-pending United States patent application Serial No. 365,354. This last apparatus is intended for coupling to the electric signal output from the detector of a vapour phase chromatography V.P.C. apparatus and operates automatically to compute and print out the values of the integrals under the successive peaks of the V.P.C. output signal. It includes a voltage/frequency converter to which the V.P.C. output signal is applied and which generates a pulse train having a recurrence frequency dependent on the magnitude of the applied signal.

In this apparatus, the converter is required to operate with considerable accuracy and stability in order to provide the necessary integration accuracy. It is also necessary that there should be an accurately linear relationship between the applied voltage and the recurrence frequency of the generated pulse train. By providing the two oscillators and "Subtracting" their outputs it is possible to avoid the difficulty which otherwise occurs with a single oscillator, of having to maintain linearity down to the very low frequencies which would be required to represent small signals. In addition any drifts or other effects due to variation of ambient conditions, particularly temperature, or ageing, for example, will tend to affect both oscillators in the same way and will therefore have no or only a diminished effect on the overall operation. With the circuits described however, it has nevertheless been found desirable to enclose the diodes 5, the transistor 4 and the transistors of the input amplifier in a constant temperature enclosure in order to ensure sufficiently drift-free operation.

What we claim is:

1. An electric pulse generator comprising first and second relaxation oscillators the circuit of each including a capacitor, a first current path for enabling the charge on the capacitor to be changed in one sense, said first current path including the base-collector circuit of a transistor connected as an amplifier in a common base configuration such that the magnitude of the emitter potential of the transistor controls the magnitude of the current flowing in the first current path, and a second current path for enabling the charge on the capacitor to be changed in the opposite sense, said second path including a Shockley diode and being arranged to pass a comparatively large current whenever the charge on the capacitor has changed by a predetermined amount in said one sense from a datum value, the pulse generator further comprising means for applying an electric signal potential to the emitter of the transistor in the first oscillator to vary the current in the first path thereof in accordance with the magnitude of the signal potential, means for applying an adjustable potential to the emitter of the transistor in the second oscillator to enable the magnitude of the current in the first path thereof to be preset, and means responsive to pulse trains generated by the two oscillators to produce an output pulse train having a recurrence frequency equal to the difference between the recurrence frequencies of the two oscillator pulse trains.

2. An electric pulse generator according to claim 1 in which each oscillator has an output circuit including a differentiating circuit for generating a short output pulse on each occasion that the Shockley diode becomes conducting.

3. An electric pulse generator according to claim 2 in which the first oscillator has pulse shaping and generating circuits associated with it for producing two output pulse trains which are identical except that one is delayed with respect to the other by a predetermined time.

4. An electric pulse generator according to claim 3 in which the pulse shaping and generating circuits include a first circuit for generating a pulse of duration equal to said predetermined time in response to each pulse produced by the oscillator and differentiating circuits for producing at a first output a pulse in response to the leading edge of each pulse generated by the first circuit and at a second output a pulse in response to the trailing edge of each pulse generated by the first circuit.

5. An electric pulse generator according to claim 3 in which the responsive means for producing the output pulse train having a recurrence frequency equal to the difference between the recurrence frequencies of the two oscillator pulse trains, comprises a two condition circuit arranged normally to be in its first condition and to be placed in its second condition by pulses of the output of the second oscillator, a first gate circuit arranged to produce an output pulse when a pulse occurs at the first output of the shaping and generating circuits and the two condition circuit is in its second state, a pulse generating circuit for producing a pulse of predetermined duration, longer than said predetermined time, in response to each pulse produced by the first gate circuit, a second gate circuit to which the pulses from the second output of the shaping and generating circuits are applied and which is controlled by the output of the pulse generating circuit to allow the pulses to pass to an output only in the absence of a pulse from the generating circuit and means for resetting the two condition circuit to its first condition whenever a pulse is produced by said pulse generating circuit.

6. An electric pulse generator according to claim 1 in which the current flowing in the first current path of each oscillator is a capacitor discharging current, whereby the first current path of each oscillator enables the charge on the corresponding capacitor to be decreased, and in which the current flowing in the second current path of each oscillator is a capacitor charging current, whereby the second current path of each oscillator enables the charge on the corresponding capacitor to be increased.

No references cited.

ROY LAKE, *Primary Examiner.*

J. KOMINSKI, *Assistant Examiner.*